United States Patent
Yuasa

(10) Patent No.: US 9,349,568 B2
(45) Date of Patent: May 24, 2016

(54) SAMPLE INTRODUCTION DEVICE AND CHARGED PARTICLE BEAM INSTRUMENT

(71) Applicant: JEOL Ltd., Tokyo (JP)

(72) Inventor: Shuichi Yuasa, Tokyo (JP)

(73) Assignee: JEOL Ltd., Tokyo (JP)

( * ) Notice: Subject to any disclaimer, the term of this patent is extended or adjusted under 35 U.S.C. 154(b) by 146 days.

(21) Appl. No.: 14/225,793

(22) Filed: Mar. 26, 2014

(65) Prior Publication Data

US 2014/0290393 A1    Oct. 2, 2014

(30) Foreign Application Priority Data

Mar. 28, 2013   (JP) .................................. 2013-68617

(51) Int. Cl.
*H01J 37/18* (2006.01)
*H01J 37/20* (2006.01)
*H01J 37/16* (2006.01)

(52) U.S. Cl.
CPC ............... *H01J 37/185* (2013.01); *H01J 37/16* (2013.01); *H01J 37/20* (2013.01); *H01J 2237/184* (2013.01)

(58) Field of Classification Search
CPC ................................. H01J 37/20; H01J 37/185
See application file for complete search history.

(56) References Cited

U.S. PATENT DOCUMENTS

| 2008/0067375 A1* | 3/2008 | Kasai | ....................... G03H 5/00 250/310 |
| 2012/0212583 A1* | 8/2012 | Yaguchi | ............. G01N 23/2204 348/46 |

FOREIGN PATENT DOCUMENTS

JP           8293278 A    11/1996

* cited by examiner

*Primary Examiner* — Paul West
(74) *Attorney, Agent, or Firm* — The Webb Law Firm

(57) ABSTRACT

A sample introduction device (100) is adapted to introduce a sample (S) into the sample chamber (1) of a charged particle beam instrument. The device includes: a pre-evacuation chamber (2) for performing a pre-evacuation; a sample holder (10) having a sample holding portion (12) capable of holding the sample (S); a support portion (20) for supporting the sample holder (10); mechanical drives (30); and goniometer (50) for moving and rotating the support portion (20) such that the sample holding portion (12) moves from inside the pre-evacuation chamber (2) into the sample chamber (1). Partition valve (70) can be activated by the action of the goniometer.

4 Claims, 8 Drawing Sheets

SAMPLE INTRODUCTION DEVICE AND CHARGED PARTICLE BEAM INSTRUMENT

BACKGROUND OF THE INVENTION

1. Field of the Invention

The present invention relates to a sample introduction device and charged particle beam instrument.

2. Description of Related Art

In a charged particle beam instrument such as a transmission electron microscope, a sample to be observed or analyzed is generally held by a sample holder. The sample held in the sample holder is inserted into the sample chamber by inserting the sample holder into the sample chamber of the transmission electron microscope (see, for example, JP-A-8-293278).

Since the interior of the sample chamber of the charged particle beam instrument such as a transmission electron microscope is kept in a vacuum, when the sample holder is inserted into the sample chamber, the pressure difference between the sample chamber and the outside exerts a force on the sample holder, thus drawing it into the sample chamber. The application of the force on the sample holder briskly draws the sample holder into the sample chamber. This creates the danger that the sample held in the sample holder will be damaged or the degree of vacuum in the sample chamber will be deteriorated. Accordingly, the user must insert the sample holder into the sample chamber while holding the sample holder in such a way that the sample holder is prevented from being drawn violently by the force into the sample chamber.

SUMMARY OF THE INVENTION

In view of the foregoing problem, the present invention has been made. According to some aspects of the present invention, it is possible to offer a sample introduction device and charged particle beam instrument permitting one to introduce a sample into a sample chamber easily.

(1) A sample introduction device associated with the present invention permits one to introduce a sample into a sample chamber of a charged particle beam instrument and includes: a pre-evacuation chamber for performing a pre-evacuation; a sample holder having a sample holding portion capable of holding the sample; a support portion for supporting the sample holder; and mechanical drives for moving the support portion such that the sample holding portion moves from inside the pre-evacuation chamber into the sample chamber.

In this sample introduction device, the support portion can be moved by the mechanical drives such that the sample holding portion of the sample holder moves from inside the pre-evacuation chamber into the sample chamber. Therefore, the sample can be easily introduced into the sample chamber.

(2) In one feature of this sample introduction device, the mechanical drives may apply a second force to the sample holder. The second force is opposite in sense to a first force applied to the sample holder by a pressure difference between the interior of the sample chamber and the outside and smaller than the first force.

(3) In another feature of this sample introduction device, there are further provided: a goniometer for rotating the sample holder; a partition valve for isolating the pre-evacuation chamber and the sample chamber from each other; and a controller for controlling the mechanical drives and the goniometer. The controller may perform an operation for controllably rotating the goniometer to open or close the partition valve, an operation for causing the mechanical drives to move the support portion such that the sample holding portion moves from inside the pre-evacuation chamber into the sample chamber, and an operation for causing the mechanical drives to move the support portion away from the sample holder.

(4) In a further feature of this sample introduction device, the mechanical drives may move the support portion such that the sample holding portion moves from inside the sample chamber into the pre-evacuation chamber.

(5) A charged particle beam instrument associated with the present invention includes a sample introduction device associated with the present invention.

This charged particle beam instrument includes the sample introduction device associated with the present invention and so a user can easily introduce a sample into the sample chamber.

DESCRIPTION OF THE INVENTION

The preferred embodiments of the present invention are hereinafter described in detail with reference to the drawings. It is to be understood that the embodiments described below do not unduly restrict the contents of the present invention delineated by the claims and that not all the configurations described below are essential constituent components of the invention.

1. Configuration of Charged Particle Beam Instrument

Figure 1:
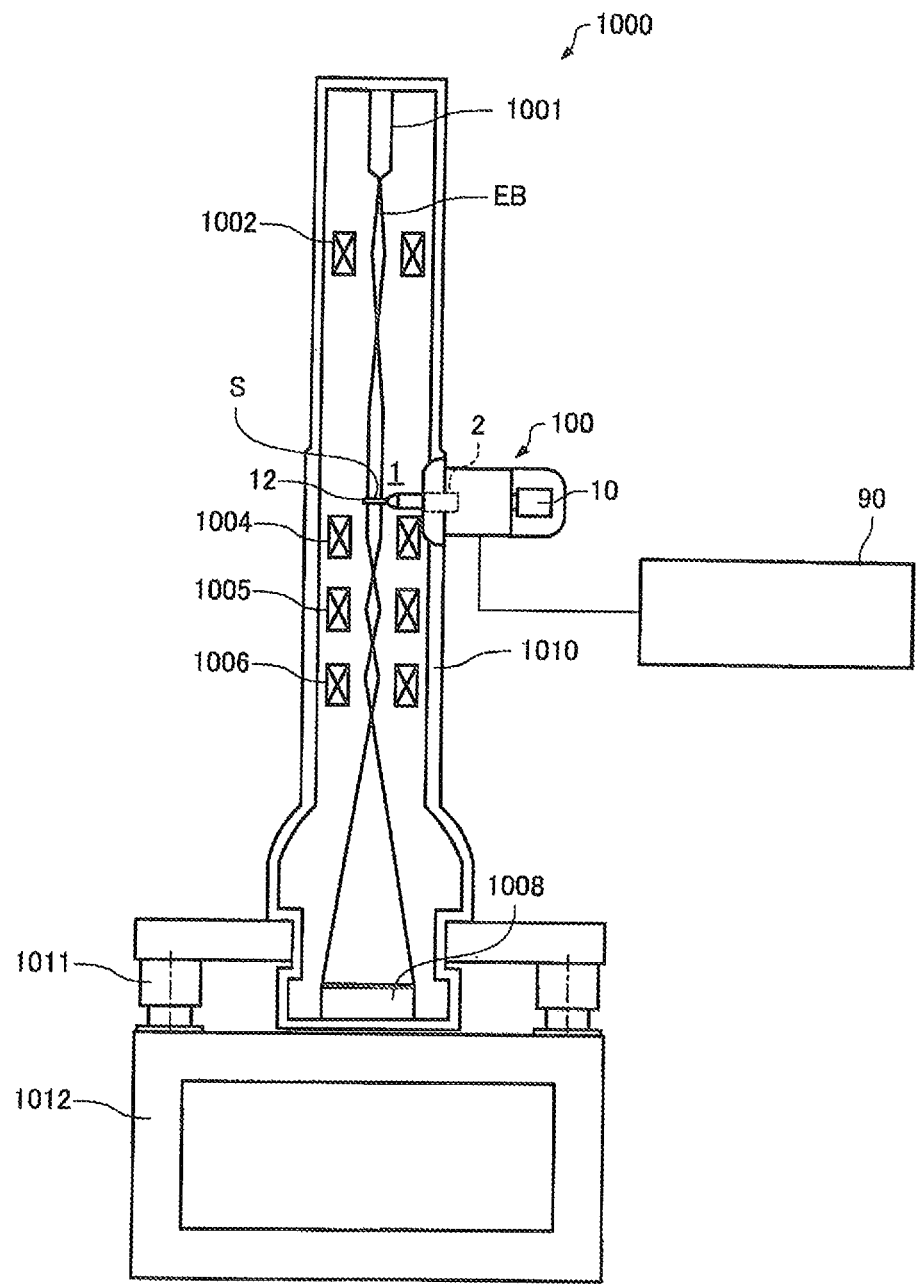
FIG. 1 is a schematic vertical cross section partly in block form of a charged particle beam instrument associated with one embodiment of the present invention.

The configuration of a charged particle beam instrument associated with one embodiment of the present invention is first described by referring to FIG. 1, where the instrument is generally indicated by reference numeral 1000.

The charged particle beam instrument 1000 is configured including a sample introduction device, 100, associated with the present invention. Note that in FIG. 1, the sample introduction device 100 is schematically shown.

As shown in FIG. 1, the charged particle beam instrument 1000 is configured including an electron beam source 1001, an illumination lens 1002, the sample introduction device 100, an objective lens 1004, an intermediate lens 1005, a projector lens 1006, an imaging device 1008, and an electron optical column 1010. It is now assumed that the charged particle beam instrument 1000 is a transmission electron microscope (TEM). In the state shown in FIG. 1, a sample holder 10 has been inserted in a sample chamber 1.

The electron beam source 1001, illumination lens 1002, objective lens 1004, intermediate lens 1005, and projector lens 1006 are incorporated in the electron optical column 1010. The interior of the column 1010 is evacuated by vacuum pumping equipment (not shown).

The electron beam source 1001 produces an electron beam EB by releasing electrons from a cathode and accelerating the electrons by an anode. A well-known electron gun can be used as the electron beam source 1001.

The illumination lens 1002 is disposed behind the electron beam source 1001 and operates to cause the electron beam EB generated by the electron beam source 1001 to be directed at a sample S. For example, the illumination lens 1002 is configured including a plurality of condenser lenses (not shown).

The sample is held by the sample holder 10 in the sample chamber 1 that is a space within the electron optical column 1010. The sample chamber 1 is maintained in a vacuum, i.e., kept at a pressure lower than atmospheric pressure. In the sample chamber 1, the sample S is irradiated with the charged particle beam (electron beam).

The sample introduction device 100 is used to introduce the sample S into the sample chamber 1. The sample introduction device 100 can move a sample holding portion 12, which holds the sample S thereon, from inside a pre-evacuation chamber 2 into the sample chamber 1 by moving the sample holder 10. Furthermore, the sample introduction device 100 can move the sample holding portion 12 from inside the sample chamber 1 into the pre-evacuation chamber 2 by moving the sample holder 10.

The sample introduction device 100 acts also as a sample stage which holds the sample S in the sample chamber 1 and which places the sample S in position within the sample chamber 1. In the illustrated example, the sample introduction device 100 operates as a side-entry stage for inserting the sample holder 10 (and the sample S) from a side of the objective lens 1004.

The sample introduction device 100 includes a controller 90 which controls the operation of mechanical drives 30 and a goniometer 50 of the sample introduction device 100 (see FIG. 2) (described later). In particular, the controller 90 controls the mechanical drives 30 and goniometer 50 to move the sample holding portion 12 from inside the pre-evacuation chamber 2 into the sample chamber 1. Furthermore, the controller 90 controls the mechanical drives 30 and goniometer 50 to move the sample holding portion 12 from inside the sample chamber 1 into the pre-evacuation chamber 2. The operation of the controller 90 will be described in detail later. The functions of the controller 90 can be accomplished, for example, by hardware, e.g., various processors (such as a CPU or DSP) or ASIC (such as a gate array) by software.

The objective lens 1004 is disposed behind the illumination lens 1002 and is a first stage of imaging lens for focusing the electron beam EB transmitted through the sample S.

The intermediate lens 1005 is disposed behind the objective lens 1004. The projector lens 1006 is disposed behind the intermediate lens 1005. The intermediate lens 1005 and projector lens 1006 operate such that the image focused by the objective lens 1004 is further magnified and focused onto the imaging device 1008.

The imaging device 1008 has a detector for detecting the electron beam EB. For example, the detector is a CCD camera having a two-dimensional array of solid-state image sensors. The imaging device 1008 captures an electron microscope image and outputs information about this image.

In the illustrated example, the charged particle beam instrument 1000 is mounted on a pedestal 1012 via vibration isolators 1011.

Figure 2:
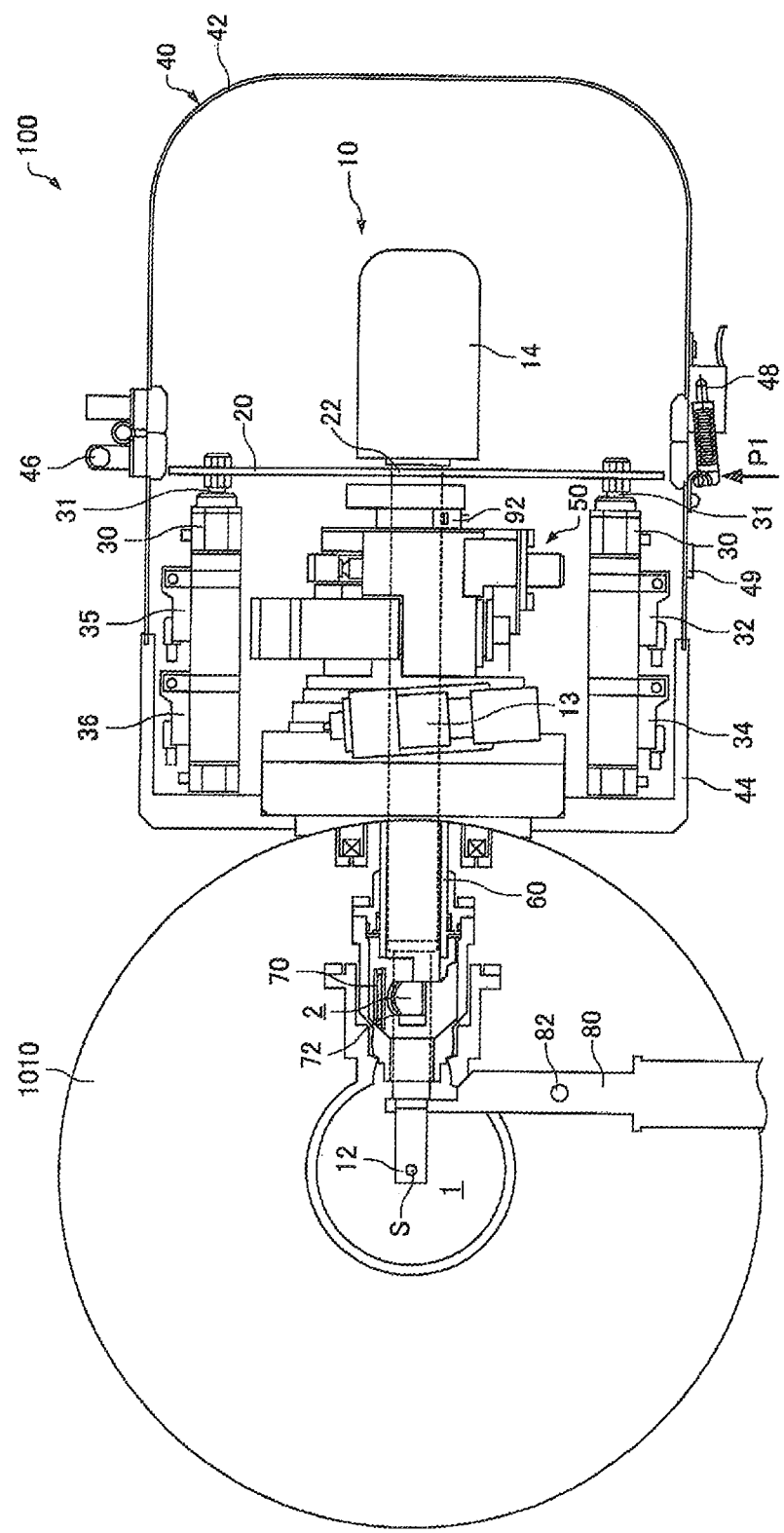
FIG. 2 is a schematic side elevation of a sample introduction device associated with one embodiment of the invention.

The sample introduction device 100 is schematically shown in FIG. 2, which is taken from above the device 100 (i.e., as viewed in the direction of motion of the electron beam EB).

As shown in FIG. 2, the sample introduction device 100 includes the pre-evacuation chamber 2, the sample holder 10, a support portion 20, and the mechanical drives 30. Furthermore, the sample introduction device 100 includes a goniometer cover 40, the goniometer 50, a sample holder insertion tube 60, a partition valve 70, a lever 80, and the controller 90 (see FIG. 1).

The pre-evacuation chamber 2 is a space that permits pre-evacuation for guiding the sample holder 10 into the sample chamber 1. The pre-evacuation is to evacuate the interior of the pre-evacuation chamber 2 down to a given pressure when the sample S is introduced into the sample chamber 1. Thus, the sample S can be introduced into the sample chamber 1 while suppressing decreases in the degree of vacuum in the sample chamber 1. The interior of the pre-evacuation chamber 2 can be pumped down from atmospheric pressure to the given pressure. For example, the pre-evacuation chamber 2 is coupled to the vacuum pumping equipment via a valve (not shown). The pre-evacuation chamber 2 is evacuated by opening this valve. A pre-evacuation is started, for example, if the user depresses a sample holder exchange switch 49 mounted on the goniometer cover 40.

The pre-evacuation chamber 2 is a space inside the sample holder insertion tube 60. The pre-evacuation chamber 2 and the sample chamber 1 are connected via the partition valve 70. The pre-evacuation chamber 2 is placed in communication with the sample chamber 1 by opening the partition valve 70, which is a vacuum valve used as a vacuum partition isolating the sample chamber 1 and the pre-evacuation chamber 2 from each other. The partition valve 70 is fixedly secured to a toothed wheel 72, which in turn is securely mounted to the goniometer 50. When the sample holder insertion tube 60 is rotated, the toothed wheel 72 rotates, thus opening or closing the partition valve 70.

The sample holder 10 is a rodlike member and configured including the sample holding portion 12, a shaft portion 13, and a grip portion 14.

The sample holding portion 12 is mounted at one longitudinal end of the shaft portion 13, while the grip portion 14 is mounted at the other end. The sample holding portion 12 can hold the sample S. The sample holding portion 12 may have either a screw (not shown) that is tightened to hold the sample S or a spring (not shown) by which the sample S is held against the sample holding portion 12 to hold the sample S. The user can grasp the grip portion 14 such that the sample holder 10 can be manually gripped. The grip portion 14 is greater in diameter than the shaft portion 13.

The pressure difference between the pressure inside the sample chamber 1 and the outside pressure (atmospheric pressure) produces a force acting on the sample holder 10 such that the holder is drawn into the sample chamber 1. The sample holder 10 is pressed against the lever 80 by this force, the lever 80 being rotatable about a pivot 82. The lever 80 can be actuated by operating an electric motor (not shown). The lever 80 permits the sample holder 10 to be moved axially of the sample holder 10.

The support portion 20 can support the sample holder 10. The support portion 20 is a member in the form of a flat plate and provided with a through-hole 22 through which the sample holding portion 12 and shaft portion 13 of the sample holder 10 pass. The support portion 20 is connected to the mechanical drives 30 which are two in number in the illustrated example. Each mechanical drive 30 has a rod 31 to which the support portion 20 is fixedly mounted. As the rod 31 makes a linear motion, the support portion 20 moves linearly. In the illustrated example, the support portion 20 is located in its initial position P1. The support portion 20 can be moved from the initial position P1 into position P2 (FIG. 4), position P3 (FIG. 6), and position P4 (FIG. 5) in turn by linear motion of the rod 31. Consequently, the sample holding portion 12 and the sample S can be moved from inside the pre-evacuation chamber 2 into the sample chamber 1 and vice versa by moving the sample holder 10.

The mechanical drives 30 move the support portion 20. In the present embodiment, each mechanical drive 30 is an air cylinder which is a mechanical device for transforming the energy of compressed air into a linear motion, for example. Each mechanical drive 30 has the rod 31 to which the support portion 20 is connected. The rod 31 is moved linearly by compressing and stretching the air cylinders 30. Consequently, the support portion 20 can be moved. In the illustrated example, the sample introduction device 100 has two mechanical drives 30 each consisting of an air cylinder. The mechanical drives 30 move the support portion 20.

Figure 6:
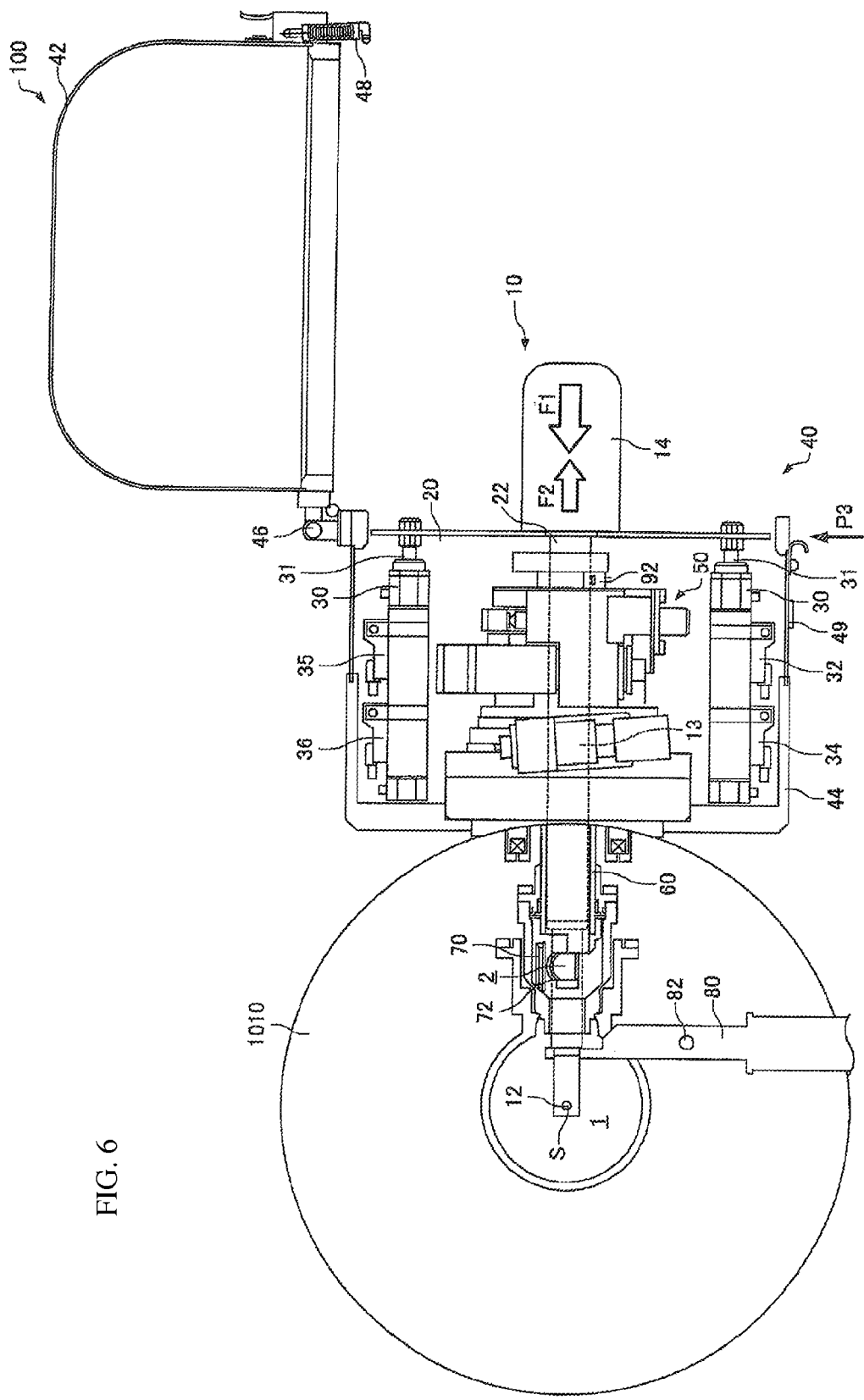

The mechanical drives 30 move the support portion 20 such that the sample holding portion 12 moves from inside the pre-evacuation chamber 2 into the sample chamber 1. In particular, the mechanical drives 30, or air cylinders, exert a force F2, which is opposite in sense to the force F1 applied to the sample holder 10 and smaller than the force F1, on the sample holder 10 utilizing the pressure difference between the interior of the sample chamber 1 and atmospheric pressure as shown in FIG. 6. This can prevent the sample holder 10 from being rammed into the sample chamber 1. Hence, the sample holding portion 12 can be moved from inside the pre-evacuation chamber 2 into the sample chamber 1 by moving the sample holder 10 at a desired speed.

Figure 7:
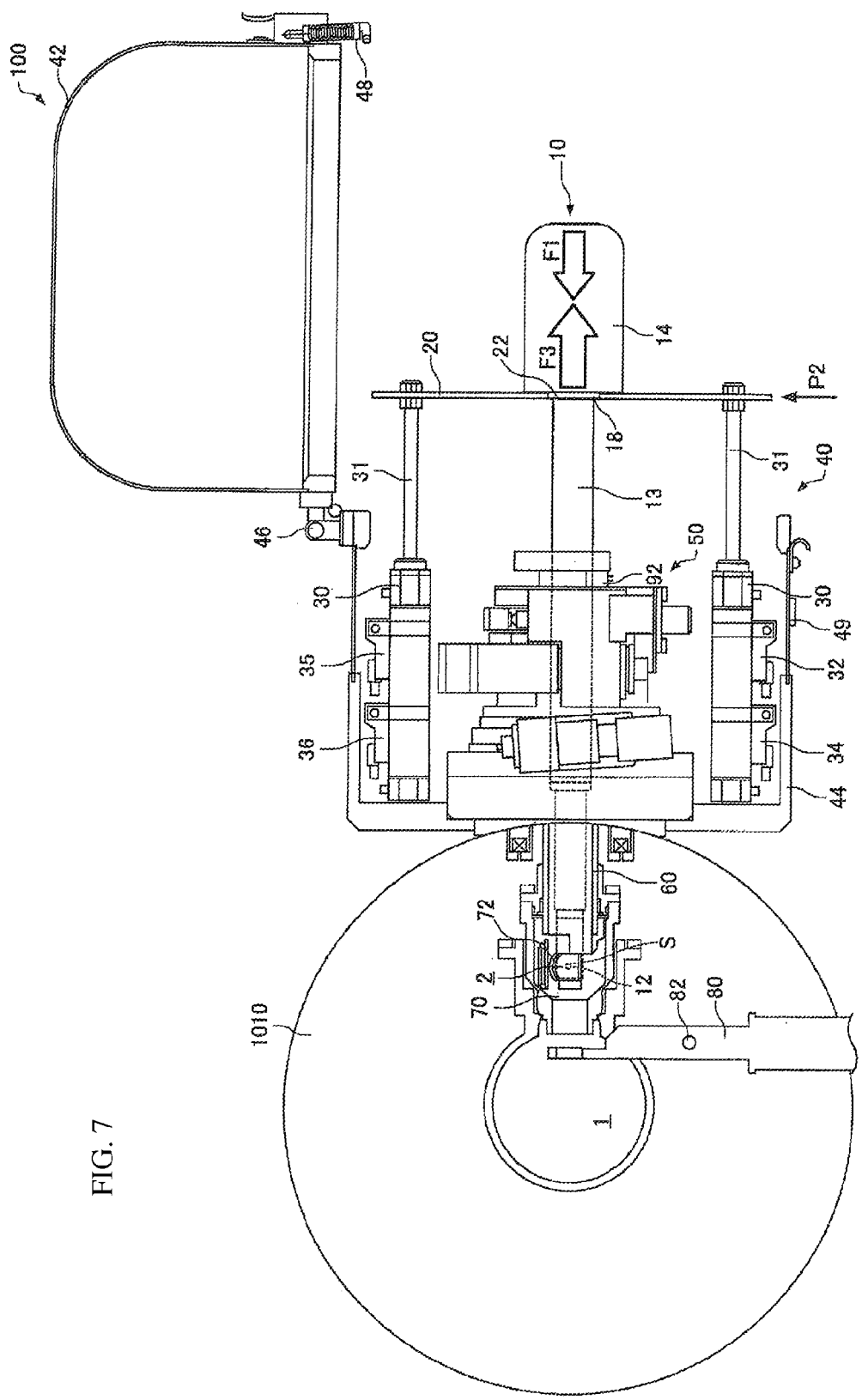

Furthermore, the mechanical drives 30 move the support portion 20 such that the sample holding portion 12 moves from inside the sample chamber 1 into the pre-evacuation chamber 2. Specifically, the mechanical drives 30 exert a force F3, which is opposite in sense to the force F1 and greater than the force F1, on the sample holder 10 as shown in FIG. 7. Consequently, it is possible to prevent the sample holder 10 from being rammed into the sample chamber 1. The sample holding portion 12 can be moved from inside the sample chamber 1 into the pre-evacuation chamber 2 by moving the sample holder 10 at a desired speed.

The operation of the mechanical drives 30 is controlled by the controller 90 (FIG. 1). A front automatic sensor 32 is used to determine the length of the mechanical drives 30 when they have been stretched. A rear automatic sensor 34 is used to determine their length when they have been compressed. Intermediate sensors 35 and 36 are disposed between the front sensor 32 and the rear sensor 34 and used to determine the length of the mechanical drives 30. That is, the upper and lower limits of the length of the mechanical drives 30 can be determined using the sensors 32, 34, 35, and 36. The range in which the support portion 20 moves can be determined by adjusting the detection positions of the sensors 32, 34, 35, and 36.

The goniometer 50 can rotate or tilt the sample holder 10 inserted in the sample holder insertion tube 60. The sample S can be tilted relative to the electron beam EB by tilting the sample holder 10 by means of the goniometer 50 and thus tilting the sample holding portion 12. The goniometer 50 is under control of the controller 90 (FIG. 1). The angular position of the goniometer 50 is detected by a potentiometer (not shown). Alternatively, the angular position of the goniometer 50 may be detected with a detector capable of detecting rotations such as an encoder.

The goniometer 50 is equipped with a sensor 92 used to sense whether it is possible to perform a pre-evacuation. This sensor 92 may also be referred to as the pre-evacuation feasibility/infeasibility detecting sensor.

The goniometer cover 40 is a container that houses the sample holder 10, support portion 20, mechanical drives 30, and goniometer 50. The goniometer cover 40 is composed of a cover portion 42 and an enclosure 44. The cover portion 42 is mounted so as to be capable of being opened and closed. The cover portion 42 is fitted with a sensor 46 to sense opening and closing of the cover portion 42. The cover portion 42 and enclosure 44 have hooks 48 for maintaining the cover portion 42 closed. The goniometer cover 40 has the sample holder exchange switch 49 for starting operation of the controller 90.

2. Operation of Sample Introduction Device

The operation of the sample introduction device 100 associated with the present embodiment is next described by referring to FIGS. 3-7, which are schematic views of the device 100.

(1) Procedure for Insertion of Sample Holder into Sample Chamber

The operation of the sample introduction device 100 performed when the sample holder 10 is inserted into the sample chamber 1 is first described.

Figure 3:
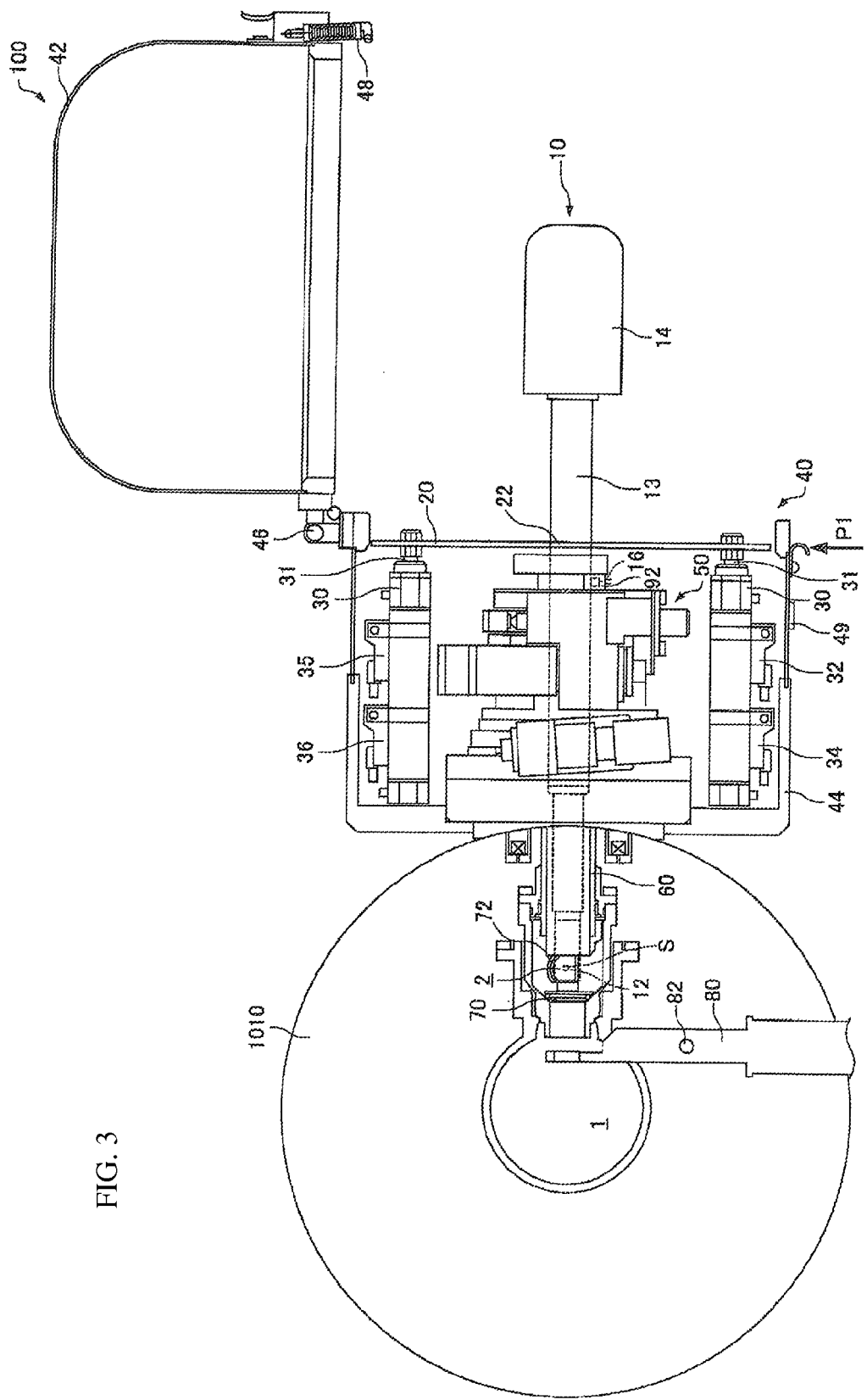
FIGS. 3-7 are side elevations similar to FIG. 2, illustrating the operation of the sample introduction device.

When the cover portion 42 is opened by the user as shown in FIG. 3, the sensor 46 for sensing opening and closing is energized, thus activating the pre-evacuation feasibility/infeasibility detecting sensor 92. Then, the user inserts the sample holder 10 into the through-hole 22 in the support portion 20 and into the sample holder insertion tube 60. Thus, the sample holder 10 (sample holding portion 12) is introduced into the pre-evacuation chamber 2. At this time, the goniometer 50 has rotated through 90 degrees to the right. The sample holder 10 is inserted into the sample holder insertion tube 60 while has rotated through 0 degree.

When the sample holder 10 is inserted into the sample holder insertion tube 60, a pin 16 protruding from the sample holder 10 pushes the pre-evacuation feasibility/infeasibility detecting sensor 92 as shown in FIG. 3. This operates the detecting sensor 92. If the user then pushes the sample holder exchange switch 49, a pre-evacuation of the pre-evacuation chamber 2 is commenced. Furthermore, the depression of the exchange switch 49 starts the following subroutine of the controller 90. At this time, the support portion 20 is located at its initial position P1 shown in FIG. 3.

Figure 8:
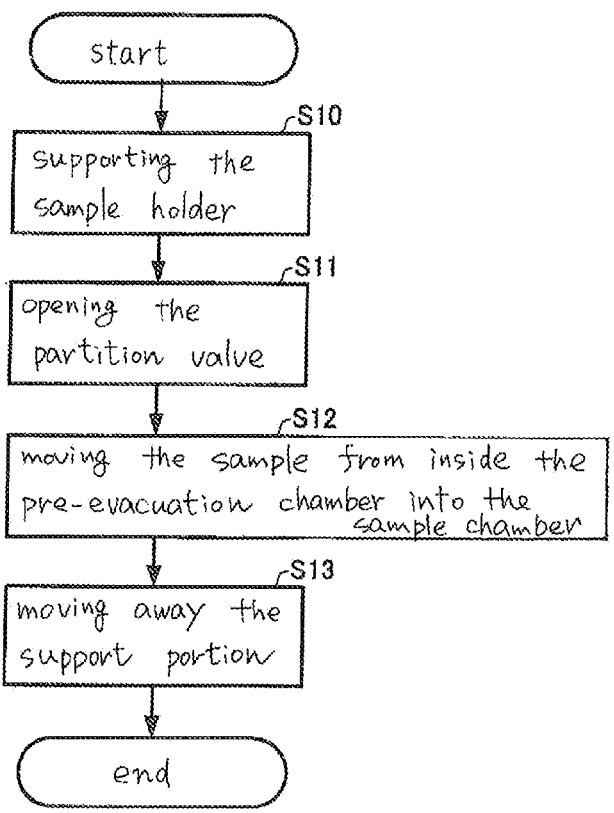
FIG. 8 is a flowchart illustrating one example of subroutine performed by a controller incorporated in the sample introduction device shown in FIGS. 2-7 when a sample holder is inserted into a sample chamber.

FIG. 8 is a flowchart illustrating one example of subroutine performed by the controller 90 of the sample introduction device 100 when the sample holder 10 is inserted into the sample chamber 1. An automatic sequence of steps S10, S11, S12, and S13 for the controller 90 is performed as described below.

Figure 4:
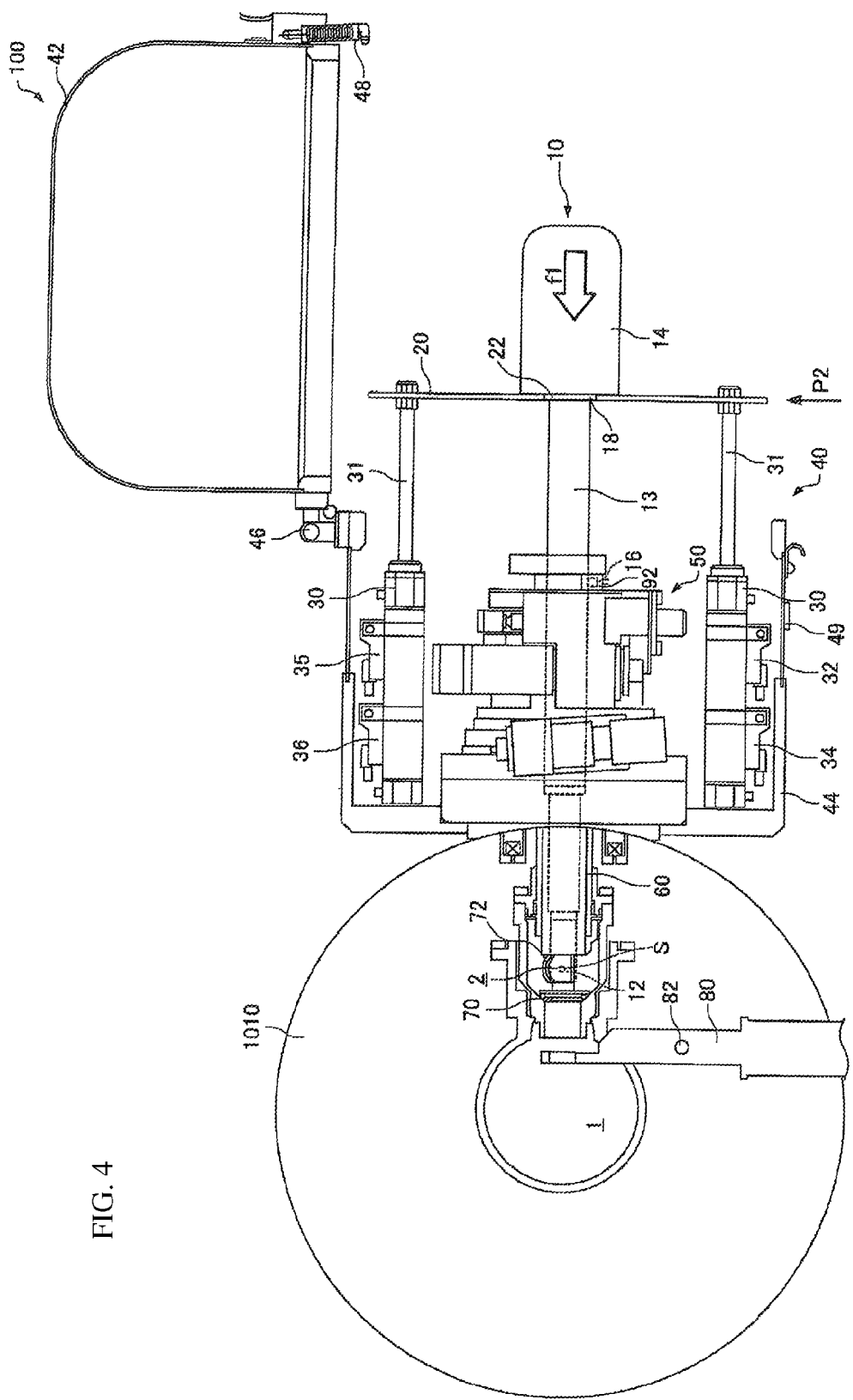

First, the controller 90 controls the mechanical drives 30 each consisting of an air cylinder to move the support portion 20 such that this support portion 20 supports the sample holder 10 as shown in FIG. 4 (S10). The mechanical drives 30 are stretched to move the support portion 20 into the position P2, where the sample holder 10 is supported by the support portion 20. More specifically, the front sensor 32 is adjusted to the position P2. The controller 90 operates to move the mechanical drives 30 into the position P2, based on the output signal from the front sensor 32. A force f1 that draws the sample holder 10 into the pre-evacuation chamber 2 is applied to the holder 10 due to the pressure difference between the pre-evacuation chamber 2 and the outside (atmospheric pressure). Therefore, the sample holder 10 can be supported by moving the support portion 20 into the position P2 and pushing the support portion 20 against the grip portion 14 of the sample holder 10.

The cross-sectional shape of the through-hole 22 in the support portion 20 is so determined that a rotation suppressing portion 18 formed on the sample holder 10 fits in the through-hole 22. Because the rotation suppressing portion 18 fits in the through-hole 22, rotation of the sample holder 10 about its own axis is suppressed.

Figure 5:
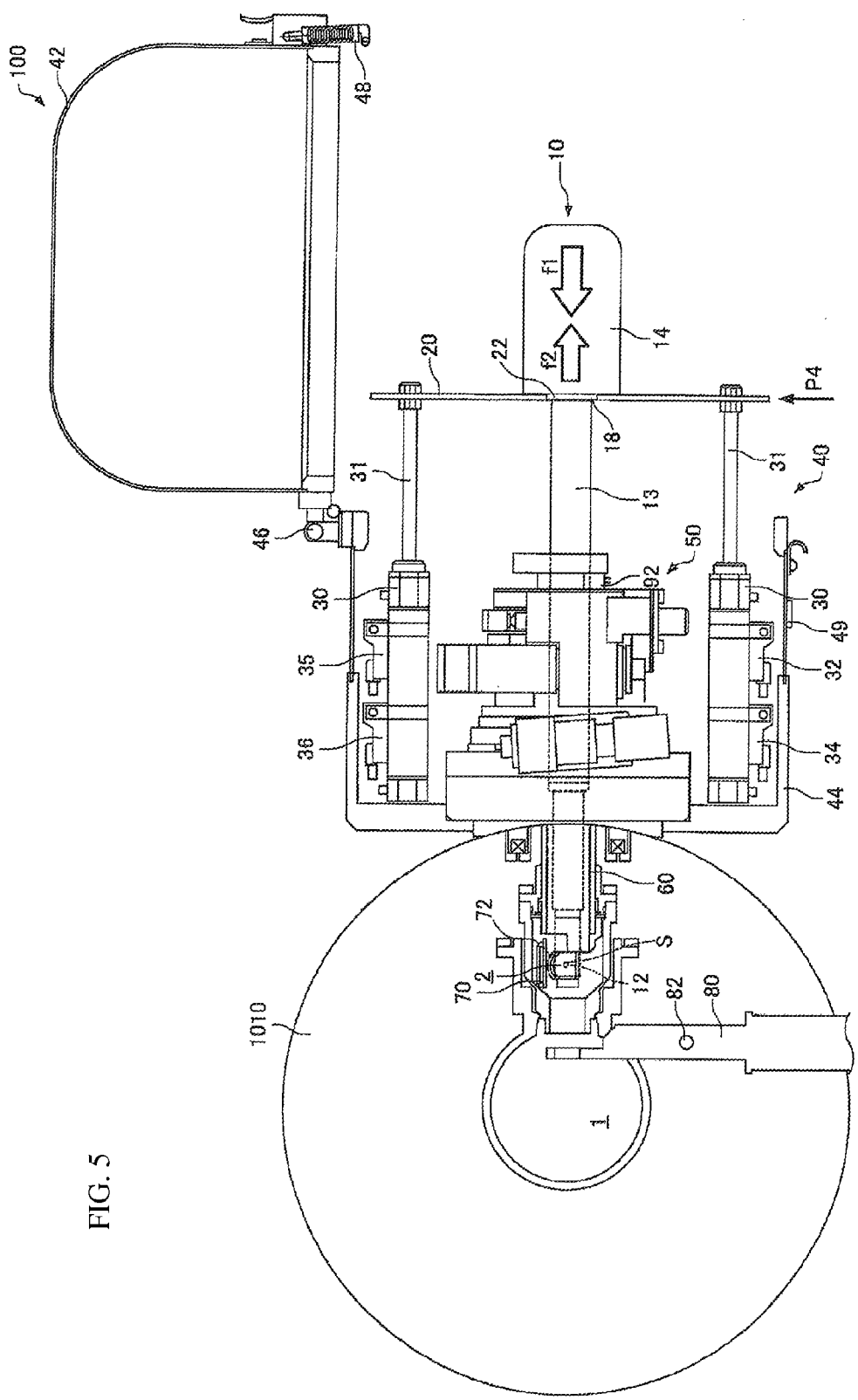

On completion of the pre-evacuation, the goniometer 50 is rotated under control of the controller 90 to open the partition valve 70 isolating the sample chamber 1 and the pre-evacuation chamber 2 from each other as shown in FIG. 5 (S11).

In particular, the goniometer 50 is first rotated through 25 degrees to the left under control of the controller 90. Since the force f1 is applied to the sample holder 10, the mechanical drives 30 apply a force f2, which is opposite in sense to the force F1 and smaller than the force f1, to the sample holder 10 to move the support portion 20 from the position P2 to the position P4. Consequently, the pin 16 on the sample holder 10 moves into a groove in the sample holder insertion tube 60. As a result, the sample holder 10 and the insertion tube 60 are coupled together. This restricts rotation of the sample holder insertion tube 60. More specifically, the intermediate sensor 35 is adjusted to the position P4. The controller 90 moves the mechanical drives 30 into the position P4, based on the output signal from the intermediate sensor 35. Then, the goniometer 50 is rotated through 65 degrees to the left under control of the controller 90. At this time, rotation of the sample holder insertion tube 60 is restricted and so the toothed gear 72 varies its angular positional relation with respect to the sample holder insertion tube 60 with rotation of the goniometer 50. As a result, the toothed wheel 72 rotates, the partition valve 70 is opened, and the pre-evacuation chamber 2 and the sample chamber 1 are placed into communication with each other. Under this condition, the force F1 is applied to the sample holder 10 due to the pressure difference between the interior of the sample chamber 1 and atmospheric pressure, thus drawing the holder 10 into the sample chamber 1.

Then, the mechanical drives 30 move the support portion 20 under control of the controller 90 such that the sample holding portion 12 is moved from inside the pre-evacuation chamber 2 into the sample chamber 1 as shown in FIG. 6 (S12). At this time, the mechanical drives 30 apply the force F2, which is opposite in sense to the force F1 and smaller than the force F1, to the sample holder 10. In consequence, the mechanical drives 30 are contracted to thereby move the support portion 20 from the position P4 (FIG. 5) to the position P3 and to move the sample holding portion 12 from inside the pre-evacuation chamber 2 into the sample chamber 1. In the example of FIG. 6, the support portion 20 is moved until the sample holder 10 abuts against the lever 80. More specifically, the intermediate sensor 36 is adjusted to the position P3. The controller 90 moves the mechanical drives 30 into the position P3, based on the output signal from the sensor 36.

The controller 90 controls the mechanical drivers 30 each consisting of an air cylinder. As shown in FIG. 2, the support portion 20 moves away from the sample holder 10 (S13). Consequently, the mechanical drives 30 are further compressed. The support portion 20 is separated from the sample holder 10 and returns to its initial position P1. More specifically, the rear sensor 34 is adjusted to the initial position P1. The controller 90 moves the mechanical drives 30 into the position P1, based on the output signal from the rear sensor 34.

As shown in FIG. 2, because the support portion 20 is separated from the sample holder 10, the sample holder 10 can be moved by the lever 80 or tilted by the goniometer 50. The controller 90 ends the subroutine after this processing step S13. The user closes the cover portion 42 of the goniometer cover 40.

By performing these processing steps, the sample holder 10 is inserted into the sample chamber 1. That is, the sample S can be introduced into the sample chamber 1.

When a predetermined time has elapsed, the controller 90 interrupts the subroutine of the steps S10, S11, S12, and S13. Furthermore, if there is a great increase or decrease in the flow rate of air supplied into the mechanical drives 30, the controller 90 interrupts the subroutine. As a consequence, the sample S can be introduced into the sample chamber 1 safely.

(2) Procedure for Taking Sample Holder Out of Sample Chamber

The operation of the sample introduction device 100 performed when the sample holder 10 is taken out of the sample chamber 1 is next described.

When the sample holder 10 has been inserted in the sample chamber 1 as shown in FIG. 2, the user opens the cover portion 42. Then, the user depresses the sample holder exchange switch 49. In response to this, the controller 90 initiates the following subroutine.

Figure 9:
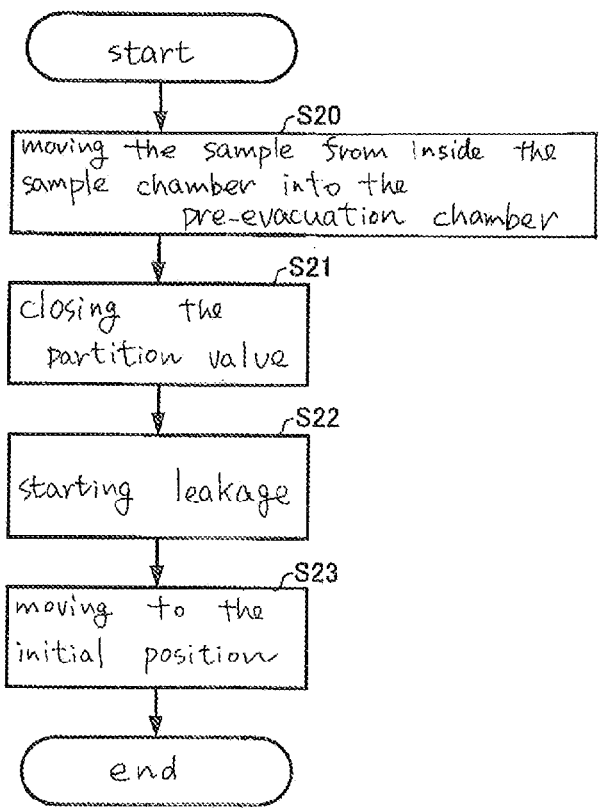
FIG. 9 is a flowchart illustrating one example of subroutine performed by the sample introduction device shown in FIGS. 2-7 when the sample holder is taken out of the sample chamber.

FIG. 9 is a flowchart illustrating one example of subroutine performed by the sample introduction device 100 when the sample holder 10 is taken out of the sample chamber 1. The controller 90 performs an automatic sequence of processing steps S20, S21, S22, and S23 as given below.

The controller 90 controls the mechanical drives 30 each consisting of an air cylinder to move the support portion 20 such that the sample holding portion 12 moves from inside the sample chamber 1 into the pre-evacuation chamber 2 as shown in FIG. 7 (S20). The mechanical drives 30 exert a force F3, which is opposite in sense to the force F1 applied to the sample holder 10 due to the pressure difference between the interior of the sample chamber 1 and the outside (atmospheric pressure) and greater than the force F1, on the sample holder 10. This stretches the mechanical drives 30, moving the support portion 20 from the position P1 (see FIG. 2) into the position P4 by way of the position P3. This moves the sample holding portion 12 from inside the sample chamber 1 into the pre-evacuation chamber 2. More specifically, the sensor 35 is adjusted to the position P4. The controller 90 performs a step for moving the mechanical drives 30 into the position P4, based on the output signal from the sensor 35.

Then, the controller 90 performs an operation for controllably rotating the goniometer 50 to close the partition valve 70 isolating the sample chamber 1 and the pre-evacuation chamber 2 from each other (S21). In particular, the controller 90 controllably rotates the goniometer 50 through 65 degrees to the right. This closes the partition valve 70, thus isolating the sample chamber 1 and the pre-evacuation chamber 2 from each other. Then, the controller 90 controls the mechanical drives 30 to move the support portion 20 from the position P4 to the position P2. Furthermore, the controller 90 controllably rotates the goniometer 50 through 25 degrees to the right. At this time, the pin 16 on the sample holder 10 pushes the pre-evacuation feasibility/infeasibility detecting sensor 92, thus activating the sensor 92. This initiates leakage from the pre-evacuation chamber 2 (S22). This is done, for example, by supplying an inert gas such as nitrogen gas into the pre-evacuation chamber 2.

After the completion of the leakage, the user can pull out the sample holder 10. When the sample holder 10 is pulled out, the pin 16 on the sample holder 10 deactivates the pre-evacuation feasibility/infeasibility detecting sensor 92. The controller 90 controls the mechanical drives 30 to move the support portion 20 such that the support portion 20 returns to its initial position P1 in an unillustrated manner (S23). More specifically, the rear sensor 34 is adjusted to the initial position P1. The controller 90 operates to move the mechanical drives 30 into their initial position P1, based on the output signal from the rear sensor 34. After the execution of the step S23, the controller 90 ends the subroutine.

By performing the subroutine described so far, the sample holder 10 is taken out of the sample chamber 1. That is, the sample S can be taken out of the sample chamber 1.

If a predetermined time has passed while the sequence of steps S20, S21, S22, and S23 is in progress, the controller 90 interrupts the sequence. Furthermore, if there is a great increase or decrease in the flow rate of air supplied into the mechanical drives 30, the controller 90 interrupts the sequence. Consequently, the sample S can be safely taken out of the sample chamber 1.

In the description provided so far, the controller 90 performs an automatic sequence of steps to move the sample holding portion 12 from inside the sample chamber 1 into the pre-evacuation chamber 2 and vice versa. Alternatively, with the sample introduction device 100, the user may manually move the sample holding portion 12 from inside the pre-evacuation chamber 2 into the sample chamber 1 and vice versa by moving the sample holder 10 without relying on an automatic sequence.

The sample introduction device 100 and charged particle beam instrument 1000 associated with the present embodiment have the following features.

The sample introduction device 100 is configured including the mechanical drives 30 for moving the support portion 20 that supports the sample holder 10 such that the sample holding portion 12 (and the sample S) is moved from inside the pre-evacuation chamber 2 into the sample chamber 1. Therefore, the sample S can be easily introduced into the sample chamber 1.

With the sample introduction device 100, the mechanical drives 30 apply the force F2, which is opposite in sense to the force F1 applied to the sample holder 10 due to the pressure difference between the interior of the sample chamber 1 and the outside (atmospheric pressure) and smaller than the force F1, to the sample holder 10. Accordingly, it is possible to prevent the sample holder 10 from being rammed into the sample chamber 1 by the force F1 applied to the sample holder 10 due to the pressure difference between the interior of the sample chamber 1 and the outside (atmospheric pressure).

In the sample introduction device 100, the controller 90 that controls the mechanical drives 30 performs the operation to controllably rotate the goniometer 50 for closing the partition valve 70, the operation for causing the mechanical drives 30 to move the support portion 20 such that the sample holding portion 12 moves from inside the pre-evacuation chamber 2 into the sample chamber 1, and the operation for causing the mechanical drives 30 to move the support portion 20 away from the sample holder 10. Consequently, the sample holding portion 12 can be moved from inside the pre-evacuation chamber 2 into the sample chamber 1 by an automatic sequence. Thus, the sample introduction device 100 permits the sample S to be introduced into the sample chamber 1 easily.

In the sample introduction device 100, the mechanical drives 30 move the support portion 20 such that the sample holding portion 12 moves from inside the sample chamber 1 into the pre-evacuation chamber 2. Therefore, the sample S can be easily moved from inside the sample chamber 1 into the pre-evacuation chamber 2. Hence, the sample introduction device 100 permits the sample S to be taken out of the sample chamber 1 easily.

Since the charged particle beam instrument 1000 is configured including the sample introduction device 100, the sample S can be easily introduced into the sample chamber 1 as described previously.

It is to be noted that the above-described embodiment is merely exemplary and that the present invention is not restricted thereto.

For example, in the above example of the sample introduction device 100, each of the mechanical drives 30 is an air cylinder as shown in FIG. 2. The mechanical drives 30 are not restricted to such a structure. For instance, each mechanical drive 30 may be a motor driven actuator activating the rod 31.

Furthermore, in the above example of the sample introduction device 100, the mechanical drives 30 are housed in the goniometer cover 40 as shown in FIG. 2. Alternatively, the drives 30 may be disposed outside the goniometer cover 40. Steps S22 and S23 may be interchanged in order. That is, step S23 may be performed prior to step S22.

Further, in the above-described embodiment, the sample introduction device 100 is applied to a transmission electron microscope. The sample introduction device 100 can also be applied to other charged particle beam instrument such as other electron microscope (e.g., an SEM or an STEM), a focused ion beam (FIB) system, or an electron beam exposure system.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described my invention with the detail and particularity requited by the Patent Laws, what is desired protected by Letters Patent is set forth in the following claims.

The invention claimed is:

1. A sample introduction device for introducing a sample into a sample chamber of a charged particle beam instrument, said sample introduction device comprising:
   a sample holder;
   an insertion tube extending toward the sample chamber and rotatable about the axis of the tube;
   a pre-evacuation chamber inside the insertion tube for performing a pre-evacuation;
   a partition valve for isolating said pre-evacuation chamber and said sample chamber from each other, said partition valve opened and closed by rotation of the insertion tube;
   a goniometer for rotating said insertion tube and the sample holder;

said sample holder linearly movable within the insertion tube and having a sample holding portion capable of holding the sample;

a linearly movable support portion for supporting the sample holder;

mechanical drives for moving the support portion such that the sample holding portion moves from inside the pre-evacuation chamber into the sample chamber; and a controller for controlling said mechanical drives and the goniometer, wherein the controller is programmed to perform an operation for controllably rotating the goniometer to open or close the partition valve, an operation for causing the mechanical drives to move said support portion such that the sample holding portion moves from inside the pre-evacuation chamber into the sample chamber, and an operation for causing the mechanical drives to move the support portion away from the sample holder.

2. The sample introduction device as set forth in claim 1, wherein a first force is applied to said sample holder by a pressure difference between the interior of said sample chamber and the outside, and wherein said mechanical drives apply a second force, which is opposite in sense to and smaller than the first force, to the sample holder.

3. The sample introduction device as set forth in claim 1, wherein said mechanical drives move said support portion such that said sample holding portion moves from inside said sample chamber into said pre-evacuation chamber.

4. The charged particle beam instrument including a sample introduction device as set forth in claim 3.

* * * * *